United States Patent
Jang et al.

(10) Patent No.: US 7,663,221 B2
(45) Date of Patent: Feb. 16, 2010

(54) PACKAGE CIRCUIT BOARD WITH A REDUCED NUMBER OF PINS AND PACKAGE INCLUDING A PACKAGE CIRCUIT BOARD WITH A REDUCED NUMBER OF PINS AND METHODS OF MANUFACTURING THE SAME

(75) Inventors: Kyung-Lae Jang, Seongnam-si (KR); Hee-Seok Lee, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 673 days.

(21) Appl. No.: 11/028,553

(22) Filed: Jan. 5, 2005

(65) Prior Publication Data

US 2005/0146018 A1 Jul. 7, 2005

(30) Foreign Application Priority Data

Jan. 7, 2004 (KR) .................... 10-2004-0000908

(51) Int. Cl.
*H01L 23/14* (2006.01)
*H01L 23/52* (2006.01)
*H01L 25/07* (2006.01)
*H01L 25/18* (2006.01)
*H01L 25/065* (2006.01)
*H01L 23/48* (2006.01)
*H01L 23/495* (2006.01)

(52) U.S. Cl. .............. 257/692; 257/E23.114; 257/E23.025; 257/E25.013; 257/E23.079; 257/E23.069; 257/E23.061; 257/698; 257/696; 257/778; 257/738; 257/784; 257/783; 257/782; 257/737; 257/691

(58) Field of Classification Search ............ 257/696, 257/786, 778, E23.114, E23.025, 738, 784, 257/783, 782, E25.013, E23.079, E23.069, 257/E23.061, 737, 692, 698
See application file for complete search history.

(56) References Cited

U.S. PATENT DOCUMENTS

| | | | | |
|---|---|---|---|---|
| 5,272,590 A | * | 12/1993 | Hernandez | ............... 361/306.2 |
| 5,909,054 A | * | 6/1999 | Kozono | ..................... 257/667 |
| 6,181,008 B1 | * | 1/2001 | Avery et al. | ................. 257/723 |
| 6,204,562 B1 | | 3/2001 | Ho et al. | |
| 6,246,301 B1 | * | 6/2001 | Sogo et al. | ................... 333/185 |
| 6,265,771 B1 | | 7/2001 | Ference et al. | |
| 6,278,264 B1 | * | 8/2001 | Burstein et al. | ............. 323/282 |
| 6,310,386 B1 | * | 10/2001 | Shenoy | ...................... 257/531 |

(Continued)

FOREIGN PATENT DOCUMENTS

JP                05129516 A        5/1993

(Continued)

OTHER PUBLICATIONS

German Office Action dated Sep. 26, 2008.

*Primary Examiner*—Alexander O Williams
(74) *Attorney, Agent, or Firm*—Harness, Dickey & Pierce

(57) ABSTRACT

A package circuit board having a reduced package size. The package circuit board may include a semiconductor substrate in place of a printed circuit board. The package circuit board may further include a microelectronic chip mounted on the semiconductor substrate, the microelectronic chip having at least one of active and passive elements formed on the semiconductor substrate semiconductor substrate.

22 Claims, 7 Drawing Sheets

U.S. PATENT DOCUMENTS

| | | |
|---|---|---|
| 6,362,525 B1 | 3/2002 | Rahim |
| 6,418,032 B2 * | 7/2002 | Hirata et al. ................. 361/780 |
| 6,424,034 B1 * | 7/2002 | Ahn et al. .................... 257/723 |
| 6,516,104 B1 * | 2/2003 | Furuyama .................... 385/14 |
| 6,522,762 B1 * | 2/2003 | Mullenborn et al. ........ 381/174 |
| 6,534,855 B1 * | 3/2003 | Ahn et al. .................... 257/698 |
| 6,667,895 B2 * | 12/2003 | Jang et al. .................... 365/63 |
| 6,809,412 B1 * | 10/2004 | Tourino et al. ............... 257/678 |
| 6,833,615 B2 * | 12/2004 | Geng et al. .................. 257/698 |
| 6,890,794 B2 * | 5/2005 | Rotem ......................... 438/108 |
| 6,957,413 B1 * | 10/2005 | McKeone et al. ............. 716/18 |
| 7,026,664 B2 * | 4/2006 | Divakar et al. ............... 257/107 |
| 7,037,752 B2 * | 5/2006 | Kuwabara et al. ........... 438/107 |
| 7,149,496 B2 * | 12/2006 | Horiuchi et al. ............. 455/333 |
| 7,166,916 B2 * | 1/2007 | Akamatsu et al. ........... 257/724 |
| 7,209,366 B2 * | 4/2007 | Prokofiev et al. ........... 361/803 |
| 7,321,166 B2 * | 1/2008 | Sakai et al. .................. 257/700 |
| 7,391,104 B1 * | 6/2008 | Chang et al. ................. 257/678 |
| 2002/0075106 A1 * | 6/2002 | Okubora et al. ............. 333/247 |
| 2002/0117748 A1 * | 8/2002 | Avery et al. ................. 257/723 |
| 2003/0006490 A1 | 1/2003 | Kawaishi |
| 2003/0025962 A1 * | 2/2003 | Nishimura .................. 359/124 |
| 2003/0198034 A1 | 10/2003 | Pu |
| 2004/0018667 A1 * | 1/2004 | Joshi et al. .................. 438/126 |
| 2004/0053014 A1 * | 3/2004 | Sato ........................ 428/195.1 |
| 2004/0203206 A1 * | 10/2004 | Rotem ......................... 438/257 |
| 2004/0212074 A1 * | 10/2004 | Divakar et al. ............... 257/698 |
| 2004/0245649 A1 * | 12/2004 | Imaoka ........................ 257/774 |
| 2004/0251560 A1 * | 12/2004 | Nakano et al. ............... 257/778 |
| 2004/0264882 A1 * | 12/2004 | Torigoe et al. ................ 385/88 |
| 2005/0067696 A1 * | 3/2005 | Terasaki ...................... 257/724 |
| 2005/0077458 A1 * | 4/2005 | Ma et al. ..................... 250/239 |
| 2005/0093173 A1 * | 5/2005 | Miller et al. ................. 257/780 |
| 2005/0093183 A1 * | 5/2005 | Lewis et al. ................... 261/94 |
| 2005/0139988 A1 * | 6/2005 | Ishida .......................... 257/700 |
| 2005/0169033 A1 * | 8/2005 | Sugita et al. ................... 365/63 |
| 2005/0218509 A1 * | 10/2005 | Kipnis et al. ................ 257/723 |
| 2005/0230823 A1 * | 10/2005 | Ohsaka ....................... 257/735 |
| 2005/0258548 A1 * | 11/2005 | Ogawa et al. ................ 257/778 |
| 2005/0277394 A1 * | 12/2005 | Inoue ....................... 455/184.1 |
| 2006/0035416 A1 * | 2/2006 | Savastiouk et al. .......... 438/125 |
| 2006/0202349 A1 * | 9/2006 | Higashida et al. ........... 257/777 |
| 2007/0035012 A1 * | 2/2007 | Deppisch et al. ............ 257/706 |
| 2008/0061811 A1 * | 3/2008 | Ong ........................... 324/763 |

FOREIGN PATENT DOCUMENTS

| | | |
|---|---|---|
| JP | 2000243907 | 9/2000 |
| KR | 10-2001-0031395 | 4/2001 |
| KR | 10-2002-0070437 | 9/2002 |

* cited by examiner

PACKAGE CIRCUIT BOARD WITH A REDUCED NUMBER OF PINS AND PACKAGE INCLUDING A PACKAGE CIRCUIT BOARD WITH A REDUCED NUMBER OF PINS AND METHODS OF MANUFACTURING THE SAME

BACKGROUND OF THE INVENTION

This application claims the priority of Korean Patent Application No. 10-2004-0000908 filed on Jan. 7, 2004, in the Korean Intellectual Property Office, the disclosure of which is incorporated herein by reference in its entirety.

1. Field of the Invention

The present invention relates generally to a package circuit board and a package including the package circuit board and method thereof, and more particularly, to a package circuit board including microelectronic chips mounted on a semiconductor substrate and a package including the package circuit board and method thereof.

2. Description of the Related Art

In the field of semiconductors, chip sizes may generally decrease while the operating speed (i.e., frequency) of electronic devices may generally increase. Thus, a current conventional package may be lighter, thinner, shorter, and/or smaller than an earlier constructed conventional package.

In conventional devices operating at lower speeds, electrical characteristics may not be considered to be factors in determining device performance. However, with the increase in the operating speed of chips, electrical characteristics of the packages may be a factor in achieving higher speeds of operation.

Electrical characteristics of package pins may also be a factor in achieving higher speeds of operation. Package pins may electrically connect chips on the package to external circuits. Various conventional package structures have been proposed with regard to the structure and arrangement of package pins.

A conventional chip package for operation at lower speeds of operation may include a lead frame and a plurality of pins which may be arranged along one side of the package. The plurality of pins may be spaced apart from one another at regular intervals. The plurality of pins may further be disposed along one side of the package in a one-dimensional arrangement using the lead frame.

However, as conventional packages are reduced in size, there may be a limitation to the maximum number of mountable pins. Further, electrical characteristics of chips for higher speeds of operation may degrade due to this limitation to the maximum number of mountable pins. The electrical characteristics may include an inductance, a capacitance and/or a resistance between the lead frame and at least one of a plurality of bonding wires within the chip. Thus, the above-described packaging technique may not be suitable for use in chips at higher speeds of operation.

Conventional chip scale packages have been proposed in order to overcome the above-described deficiency with respect to conventional packages. The conventional chip scale packages may allow a reduced package size for chips at higher speeds of operation.

The conventional chip scale package may include a plurality of pins and/or solder balls which may be arranged on at least one surface of a package in a two-dimensional matrix type. The chip scale package may reduce parasitic electric components of the pins and/or the solder balls as compared to the above-described conventional package using the lead frame. Thus, the conventional chip scale package may be suitable for use in both smaller sized and/or higher speed chips.

A conventional ball grid array (BGA) package may include a wafer, microelectronic chips mounted on a first surface of the wafer, and input/output (I/O) pins (i.e., solder balls) which may be formed on a second surface of the wafer. The I/O pins may be electrically connected to at least one microelectronic chip. The microelectronic chips may be supported by the wafer and connected to the I/O pins through the wafer.

In conventional chip scale packages, the package size may be reduced in order to keep pace with the reduced size of microelectronic chips mounted thereon. The number of I/O pins (i.e., the number of solder balls) may be a factor affecting the size of the conventional chip scale package. Since a microelectronic chip may require a reduced number of I/O pins (i.e., solder balls), the reduction of the size of the conventional chip scale packages may be limited and dependent upon the limited number of I/O pins.

SUMMARY OF THE INVENTION

An example embodiment of the present invention is a package circuit board, including a semiconductor integrated circuit formed on a first surface of a semiconductor substrate, the semiconductor integrated circuit processing at least one signal associated with a microelectronic chip, and a plurality of signal input/output (I/O) ports formed on a second surface of the semiconductor substrate, the second surface not including the first surface, at least a portion of the second surface being electrically connected to the semiconductor integrated circuit.

Another example embodiment of the present invention is a method of reducing a number of input/output (I/O) ports on a semiconductor substrate, including receiving a first voltage at a semiconductor substrate, the first voltage being the only power supply voltage received by the semiconductor substrate, converting the first voltage into at least one other power supply voltage, and supplying the at least one other supply voltage to a microelectronic chip.

Another example embodiment of the present invention is a package circuit board, including a plurality of input/output (I/O) ports including a plurality of power supply pins and a semiconductor substrate for receiving a single power supply voltage from the plurality of power supply pins and converting the single power supply voltage into at least one other power supply voltage, wherein a microelectronic chip includes at least one device requiring the at least one other power supply voltage.

Another example embodiment of the present invention is a method of forming a package circuit board, including forming a semiconductor integrated circuit formed on a first surface of a semiconductor substrate, the semiconductor integrated circuit processing at least one signal associated with a microelectronic chip and forming a plurality of signal input/output (I/O) formed on a second surface of the semiconductor substrate, the second surface not including the first surface, at least a portion of the second surface being electrically connected to the semiconductor integrated substrate.

BRIEF DESCRIPTION OF THE DRAWINGS

The present invention will become more apparent by describing in detail exemplary embodiments thereof with reference to the attached drawings in which.

Figure 1A:
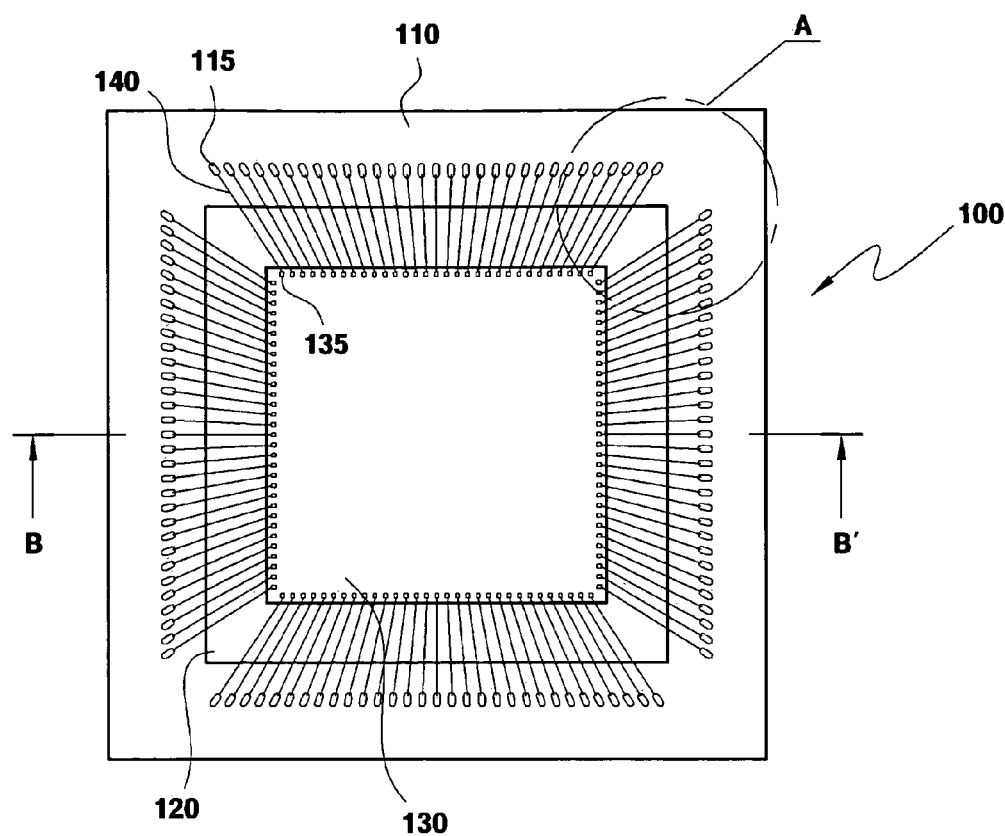
FIG. 1A illustrates a top view of a package according to an example embodiment of the present invention.

DETAILED DESCRIPTION OF EXAMPLE
EMBODIMENTS OF THE PRESENT
INVENTION

Hereinafter, example embodiments of the present invention will be described in detail with reference to the accompanying drawings.

In the Figures, the same reference numerals are used to denote the same elements throughout the drawings.

In an example embodiment of the present invention, a microelectronic chip may include an integrated semiconductor memory chip.

In another example embodiment of the present invention, the integrated semiconductor memory chip may include a dynamic random access memory (DRAM), a synchronous random access memory (SRAM), a flash memory, a microelectromechanical system (MEMS) chip, an optoelectronic device, and/or a processor.

In another example embodiment of the present invention, the processor may include a central processing unit (CPU) and/or a digital signal processor (DSP).

In another example embodiment of the present invention, the microelectronic chip may include a plurality of electronic device chips of a same type and/or a plurality of electronic device chips of different types (e.g., a single chip data processing device).

In another example embodiment of the present invention, the single chip data processing device may include a processor, a memory, and/or peripheral devices.

In another example embodiment of the present invention, the processor may include a complex instruction set computer (CISC) CPU and/or a reduced instruction set computer (RISC) CPU. The processor may be a DSP and/or a combination of a CPU and a DSP. The memory may include a volatile memory and/or a non-volatile memory. Examples of volatile memory may include but are not limited to a SRAM and/or a DRAM. Examples of non-volatile memory may include but are not limited to a mask ROM, an EEPROM, and/or a flash memory. The peripheral devices may include at least one general device and/or special device. Examples of the general device may include but are not limited to a detector, a counter, a timer, an I/O port, and/or a controller. Examples of the special device may include but are not limited to a liquid crystal display (LCD) controller, a graphics controller and/or a network controller. The processor, the memory, and the peripheral devices may be connected to one another via buses (e.g., address, data, and/or control buses) such that the single chip data processing device may store, read, and/or process data.

In another example embodiment of the present invention, a microelectronic chip may be mounted on a package circuit wafer formed a semiconductor substrate. Examples of the semiconductor substrate may include, but are not limited to, a silicon wafer, a Silicon-On-Insulator (SOI) wafer, a gallium arsenic wafer, a silicon germanium wafer, a ceramic wafer, and/or a quartz wafer.

In another example embodiment of the present invention, the semiconductor substrate may be micro-fabricated, and a semiconductor integrated circuit may be mounted on the semiconductor substrate, which may enhance the operational efficiency of the microelectronic chip. The semiconductor integrated circuit may include a multiplexer, a voltage converter, and/or any other type of semiconductor integrated circuit. For example, when the microelectronic chip requires two or more different levels of supply voltages, the semiconductor integrated circuit may include a voltage converter.

Hereinafter, a package 100 according to an example embodiment of the present invention will be described more fully with reference to FIGS. 1A through 1E.

Figure 1B:
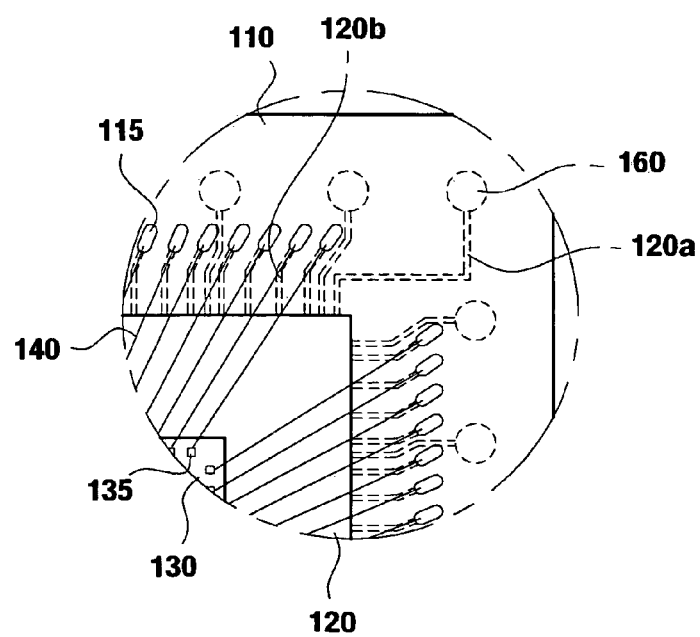
FIG. 1B illustrates an enlarged view of a portion A of FIG. 1A.
Figure 1C:
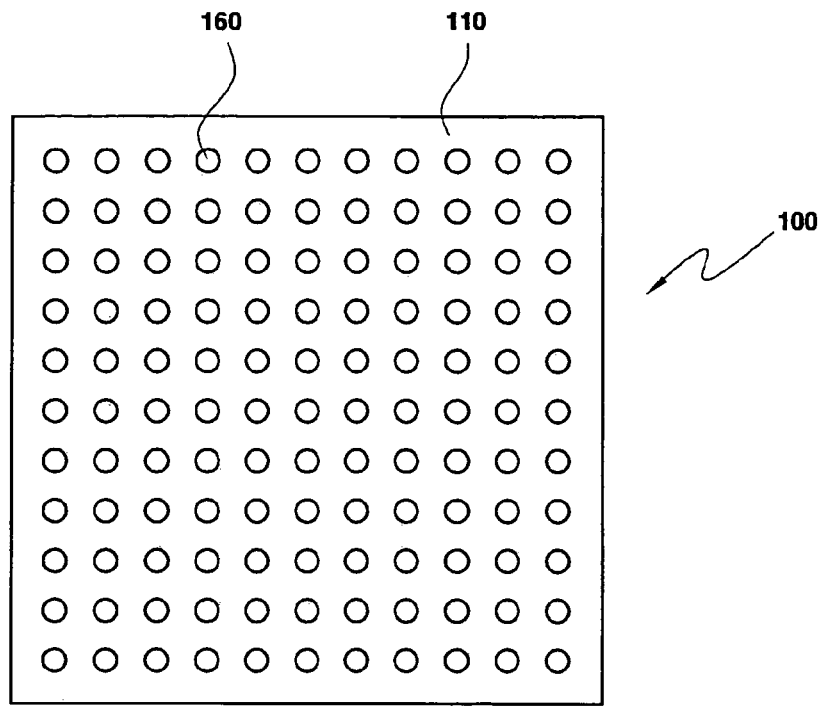
FIG. 1C illustrates a bottom view of the package of FIG. 1A.
Figure 1D:
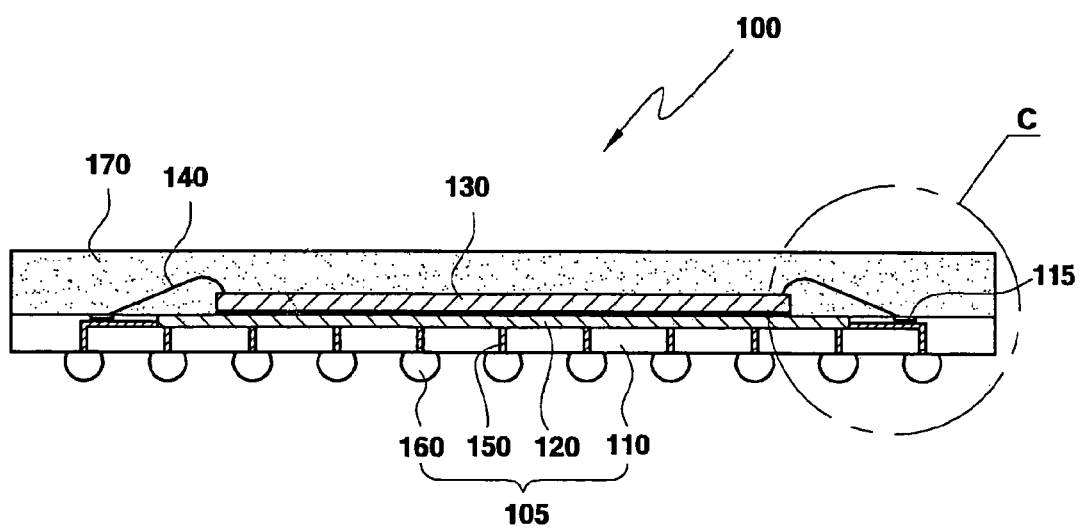
FIG. 1D illustrates a cross-sectional view of the package along line B-B' of FIG. 1A.
Figure 1E:
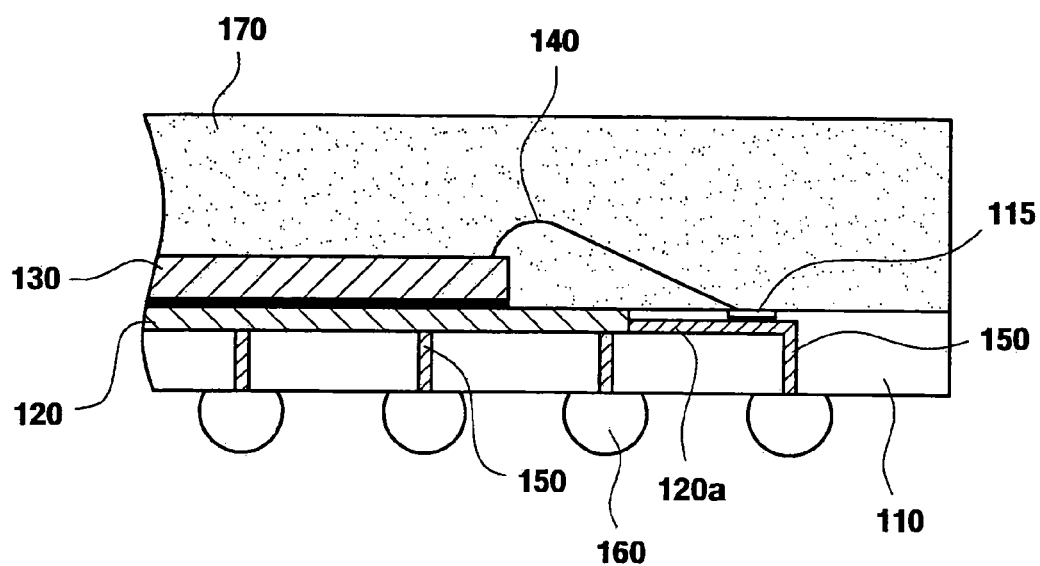
FIG. 1E illustrates an enlarged view of a portion C of the package of FIG. 1D.

FIG. 1A illustrates a top view of the package 100 according to an example embodiment of the present invention. FIG. 1B illustrates an enlarged view of a portion A of FIG. 1A. FIG. 1C illustrates a bottom view of the package 100 of FIG. 1A. FIG. 1D illustrates a cross-sectional view of the package 100 along line B-B' of FIG. 1A. FIG. 1E illustrates an enlarged view of a portion C of the package 100 of FIG. 1D.

In another example embodiment of the present invention, referring to FIGS. 1A-1E, the package 100 may include a package circuit board 105. The package 100 may further include a microelectronic chip 130 mounted on the package circuit board 105. The package circuit board 105 may include a semiconductor substrate 110 (e.g., a semiconductor integrated circuit 120 formed on a surface of the semiconductor substrate 110 through patterning), and a plurality of signal input/output (I/O) ports 160 which may be connected to a via hole 150. An example of the semiconductor substrate 110 may include a silicon substrate. The microelectronic chip 130 may be configured to receive and process externally applied signals.

In another example embodiment of the present invention, the microelectronic chip 130 may be electrically connected to the semiconductor substrate 110 with bonding wires 140.

In another example embodiment of the present invention, referring to FIG. 1B, a substrate pad 115 may be formed on the semiconductor substrate 110 and a chip pad 135 may be formed on the microelectronic chip 130. The substrate pad 115 and the chip pad 135 may be electrically connected to each other with the bonding wires 140.

In another example embodiment of the present invention, referring to FIG. 1C, the signal I/O ports 160 may be arranged on the bottom of the semiconductor substrate 110 in a grid pattern.

In another example embodiment of the present invention, solder balls may be used as the signal I/O ports 160.

Hereinafter, a transmission path of signals between the microelectronic chip 130 and the signal I/O ports 160 will be described more fully with reference to FIGS. 1B, 1D, and 1E.

In another example embodiment of the present invention, the chip pad 135 may be electrically connected to the substrate pad 115 on the semiconductor substrate 110 with the bonding wires 140

In another example embodiment of the present invention, the substrate pad 115 may be electrically connected to the semiconductor integrated circuit 120 with a second wiring pattern 120*b*. The semiconductor integrated circuit 120 may be electrically connected to the signal I/O ports 160 with a first wiring pattern 120*a* and a conductive material in the via hole 150.

In another example embodiment of the present invention, the via hole 150 may be formed on a portion of the semiconductor substrate 110 by using an etching technique and/or a laser technique. The via hole 150 may be electrically connected to at least one of the semiconductor integrated circuit 120 and the first wiring pattern 120*a* on the top surface of the semiconductor substrate 110. The via hole 150 may be electrically connected to the signal I/O ports 160 on the bottom surface of the semiconductor substrate 110.

In another example embodiment of the present invention, the conductive material filling the via hole 150 may include Cu, Al, Ag, Au, Ni and/or any other well-known conductive material.

In another example embodiment of the present invention, the conductive material may be applied through a process of sputtering, chemical vapor deposition, electroplating and/or any other well-known application process.

In another example embodiment of the present invention, signals input to and/or output from the microelectronic device 130 may be processed through the semiconductor integrated circuit 120. The processed signals may be transmitted to at least one external device through the signal I/O ports 160.

In another example embodiment of the present invention, the package 100 may include a memory device. Address and command signals may be transmitted through the signal I/O ports 160 and data may be written to and/or read from the memory device based on the address and command signals.

In another example embodiment of the present invention, referring to FIGS. 1D and 1E, the microelectronic chip 130 and the bonding wires 140 may be encapsulated by an insulating encapsulation resin 170. The insulating encapsulation resin 170 may improve the reliability of an electrical connection between the microelectronic chip 130 and the bonding wires 140 and/or strengthen an adhesion between the microelectronic chip 130 and the bonding wires 140. Examples of the insulating encapsulation resin 170 may include an epoxy resin, and/or any other well-known adhesive resin (e.g., a silicon resin).

Hereinafter, a package 200 according to another example embodiment of the present invention will be described with reference to FIGS. 2A through 2D.

Figure 2A:
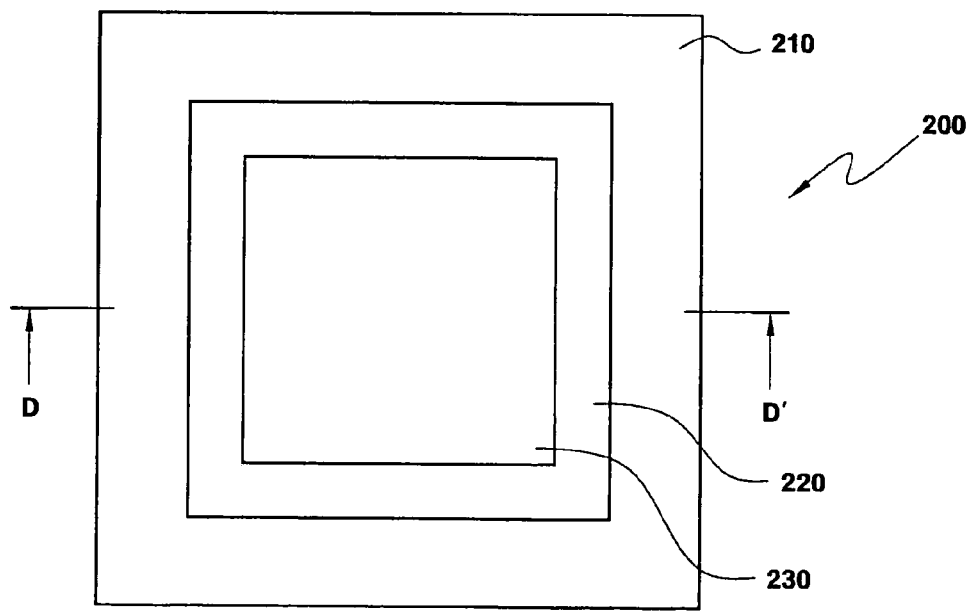
FIG. 2A illustrates a top view of another package according to an example embodiment of the present invention.
Figure 2B:
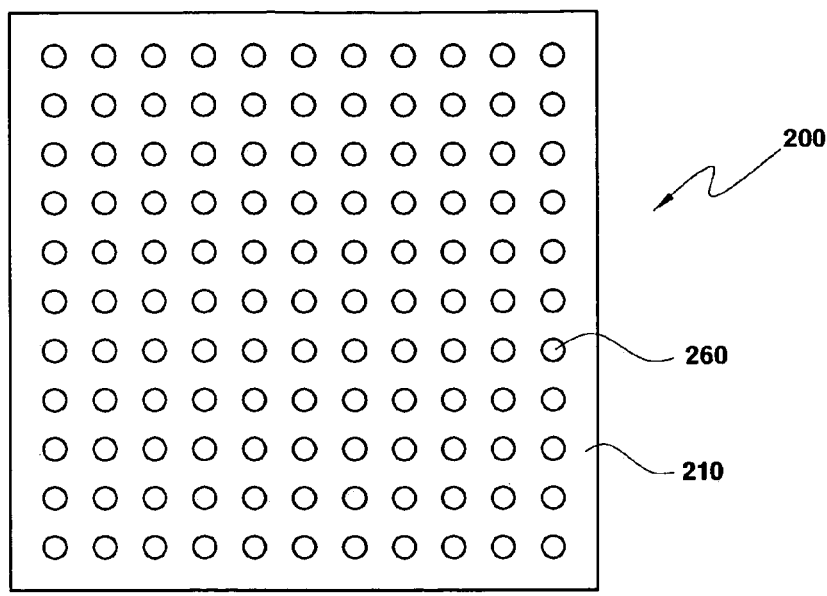
FIG. 2B illustrates a bottom view of the package of FIG. 2A.
Figure 2C:
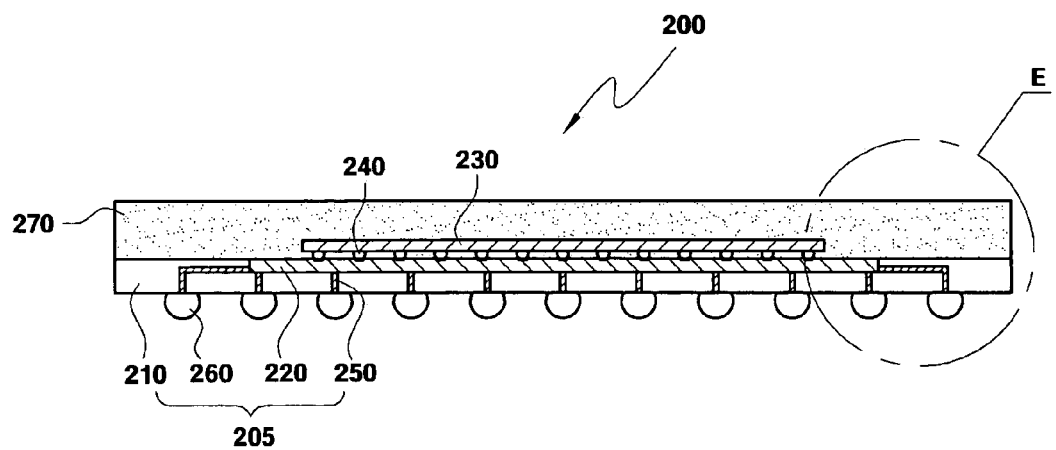
FIG. 2C illustrates a cross-sectional view of the package along line D-D' of FIG. 2A.
Figure 2D:
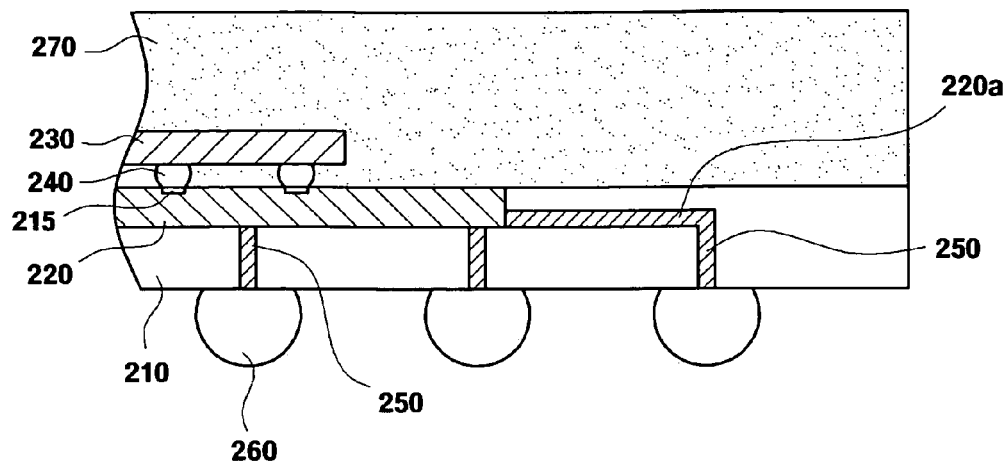
FIG. 2D illustrates an enlarged view of a portion E of FIG. 2C.

FIG. 2A illustrates a top view of the package 200 according to an example embodiment of the present invention. FIG. 2B illustrates a bottom view of the package 200 of FIG. 2A. FIG. 2C illustrates a cross-sectional view of the package 200 along line D-D' of FIG. 2A. FIG. 2D illustrates an enlarged view of a portion E of FIG. 2C.

In another example embodiment of the present invention, referring to FIGS. 2A through 2D, the package 200 may include a package circuit board 205. The package 200 may further include a microelectronic chip 230 mounted on the package circuit board 205. The package circuit board 205 may include a semiconductor substrate 210, a semiconductor integrated circuit 220 formed on at least one surface of the semiconductor substrate 210 (e.g., through patterning), and a plurality of signal I/O ports 260 which may be connected to a via hole 250.

In another example embodiment of the present invention, the semiconductor substrate 210 may include a silicon substrate.

In another example embodiment of the present invention, the microelectronic chip 230 may be configured to receive and process externally applied signals.

In another example embodiment of the present invention, the microelectronic chip 230 may be electrically connected to the semiconductor substrate 210 with bonding using flip chips 240.

In another example embodiment of the present invention, referring to FIG. 2D, a substrate pad 215 may be formed on the semiconductor substrate 210. The substrate pad 215 may be electrically connected to the microelectronic chip 230 by the flip chips 240 such that the substrate pad 215 and the microelectronic chip 230 may be electrically connected to each other.

In another example embodiment of the present invention, referring to FIG. 2B, the signal I/O ports 260 may be arranged on the bottom surface of the semiconductor substrate 210 in a grid pattern.

In another example embodiment of the present invention, solder balls may be used as the signal I/O ports 260.

Hereinafter, a transmission path of signals between the microelectronic chip 230 and the signal I/O ports 260 will be described with reference to FIG. 2D.

In another example embodiment of the present invention, the microelectronic chip 230 may be electrically connected to the substrate pad 215 by bonding using flip chips 240 such that the microelectronic chip 230 and the substrate pad 215 may be electrically connected to each other. The substrate pad 215 may further be electrically connected to the semiconductor integrated circuit 220. The semiconductor integrated circuit 220 and the signal I/O ports 260 may be electrically connected with a wiring pattern 220*a* and/or a conductive material filling the via hole 250. The via hole 250 may be manufactured using the same method that may be used for manufacturing the via hole 150 as discussed above. The via hole 250 may further be filled with the same material as the material filling the via hole 150 and/or any other well-known conductive material.

In another example embodiment of the present invention, signals input to or output from the microelectronic device 230 may be processed by the semiconductor integrated circuit 220 and may be transmitted to at least one external device via the signal I/O ports 260.

In another example embodiment of the present invention, the package 200 may include a memory device. Address and command signals may be transmitted through the signal I/O ports 260 and data may be written to and/or read from the package 200 based on the address and command signals.

In another example embodiment of the present invention, referring to FIGS. 2C and 2D, the microelectronic chip 230 and the flip chips 240 may be encapsulated by an insulating encapsulation resin 270.

Figure 3:
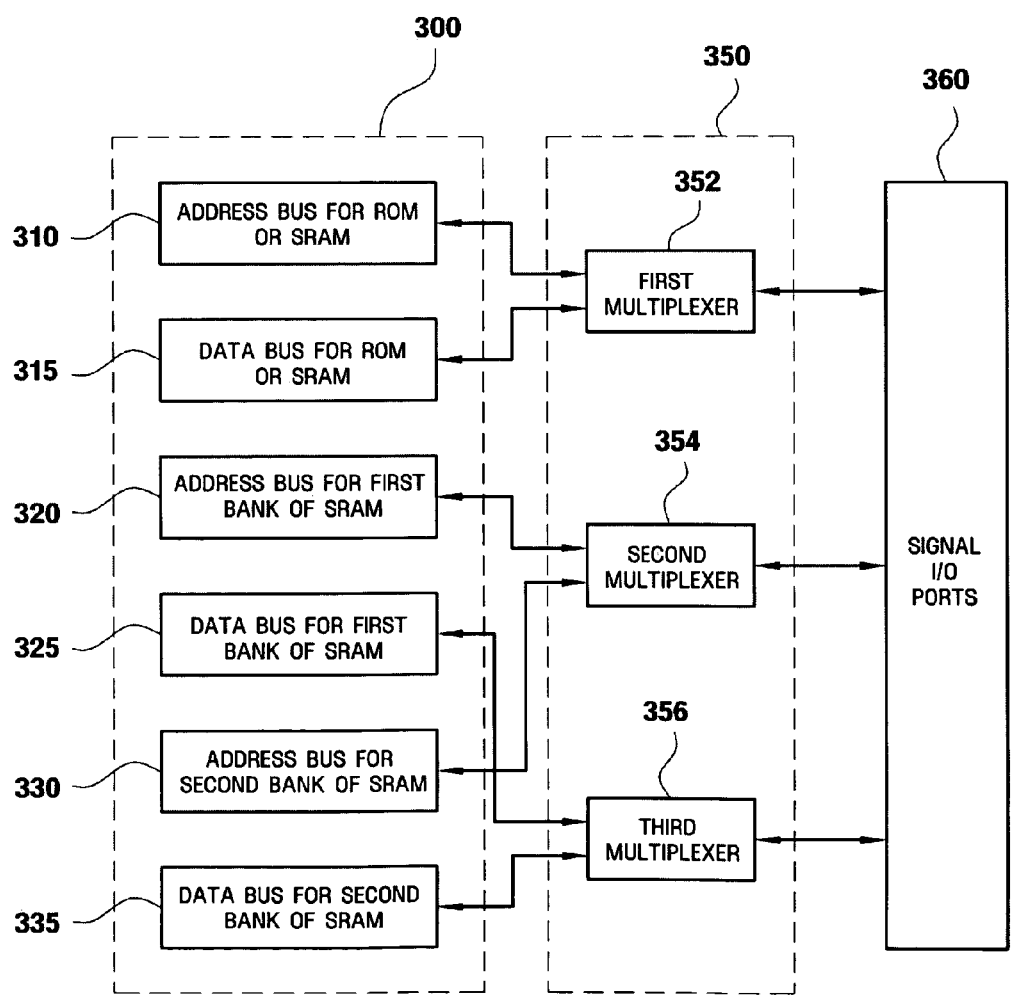
FIG. 3 illustrates a block diagram of an arrangement according to an example embodiment of the present invention.

FIG. 3 illustrates a block diagram of an arrangement according to an example embodiment of the present invention.

In another example embodiment of the present invention, referring to FIG. 3, bus arrangement 300 may include the microelectronic chips 130 and/or 230, and multiplexer arrangement 350 may include the semiconductor integrated circuits 120 and/or 220 which may be formed on at least one surface of the semiconductor substrates 110 and/or 210, and signal I/O ports 360 may include the signal I/O terminals 160 and/or 260. The signal I/O ports 360 may further include solder balls and/or pins.

In another example embodiment of the present invention, referring to FIG. 3, when the bus arrangement 300 includes at least one read only memory (ROM), which may be used as a storage device for storing set-up information of a basic I/O system (BIOS), and/or a static random access memory (SRAM), which may be used as a cache memory, an address bus 310 and a data bus 315 may not operate simultaneously. Thus, a first multiplexer 352 may be electrically connected to the address bus 310 and/or the data bus 315 such that the address bus 310 and/or the data bus 315 may share at least one signal I/O pin. For example, in a case where 26 pins are allotted to the address bus 310 (i.e., for a power supply voltage) and 15 pins are allotted to the data bus 315 (i.e., for a power supply voltage), a total number of required signal I/O ports 360 may be reduced from 41 (i.e., the sum of 15 and 26) to 26 by connecting the first multiplexer 352 to the address bus 310 and the data bus 315.

In another example embodiment of the present invention, when address and data buses 320 and 325 are allotted to a first bank of an SDRAM, which may be used as a main memory, and address and data buses 330 and 335 are allotted to a second bank of the SDRAM, the first bank and the second bank may not operate simultaneously. Thus, the first and second banks may share address and/or data buses. In other words, the first and second banks may share signal I/O pins, for example by connecting a second multiplexer 354 to the address bus 320 of the first bank and the address bus 330 of the second bank and/or connecting a third multiplexer 356 to the data bus 325 of the first bank and the data bus 335 of the second bank. For example, when 15 pins are allotted to each of the address buses 320 and 330 and 32 pins are allotted to each of the data buses 325 and 335, a total number of signal I/O ports 360 may be reduced from 94 (i.e., the sum of 30 pins for each of the address buses 320 and 330 and 64 pins for the data buses 325 and 335) to 47 (i.e., the sum of 15 pins for one of the address buses 320 and 330 and 32 pins for one of the data buses 325 and 335) by using the second and third multiplexers 354 and 356, respectively.

Figure 4:
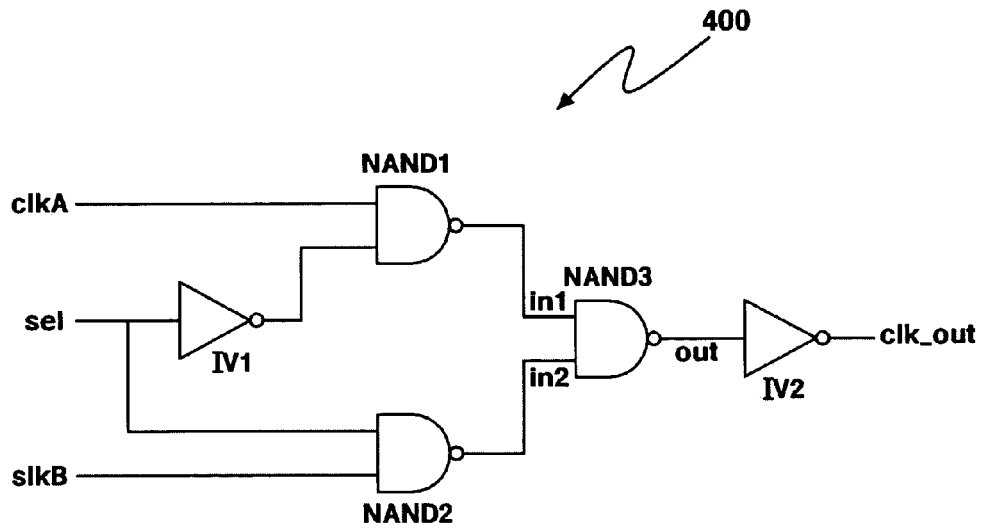
FIG. 4 illustrates a logic circuit diagram of a multiplexer according to an example embodiment of the present invention.

FIG. 4 illustrates a logic circuit diagram of a multiplexer 400 according to an example embodiment of the present invention.

In another example embodiment of the present invention, referring to FIG. 4, the multiplexer 400 may include a first NAND gate NAND1, which may receive a first clock signal clkA and an inverse signal of a control signal sel, a second NAND gate NAND2, which may receive the control signal sel and a second clock signal clkB, a third NAND gate NAND3, which may receive an output signal in1 of the first NAND gate NAND1, and an inverter IV2, which may receive an output signal out of the third NAND gate NAND3 and may output an inverse signal clk_out.

In another example embodiment of the present invention, the multiplexer 400 may output the first and/or second clock signal clkA and clkB as the output signal clk_out based on the control signal sel.

Figure 5:
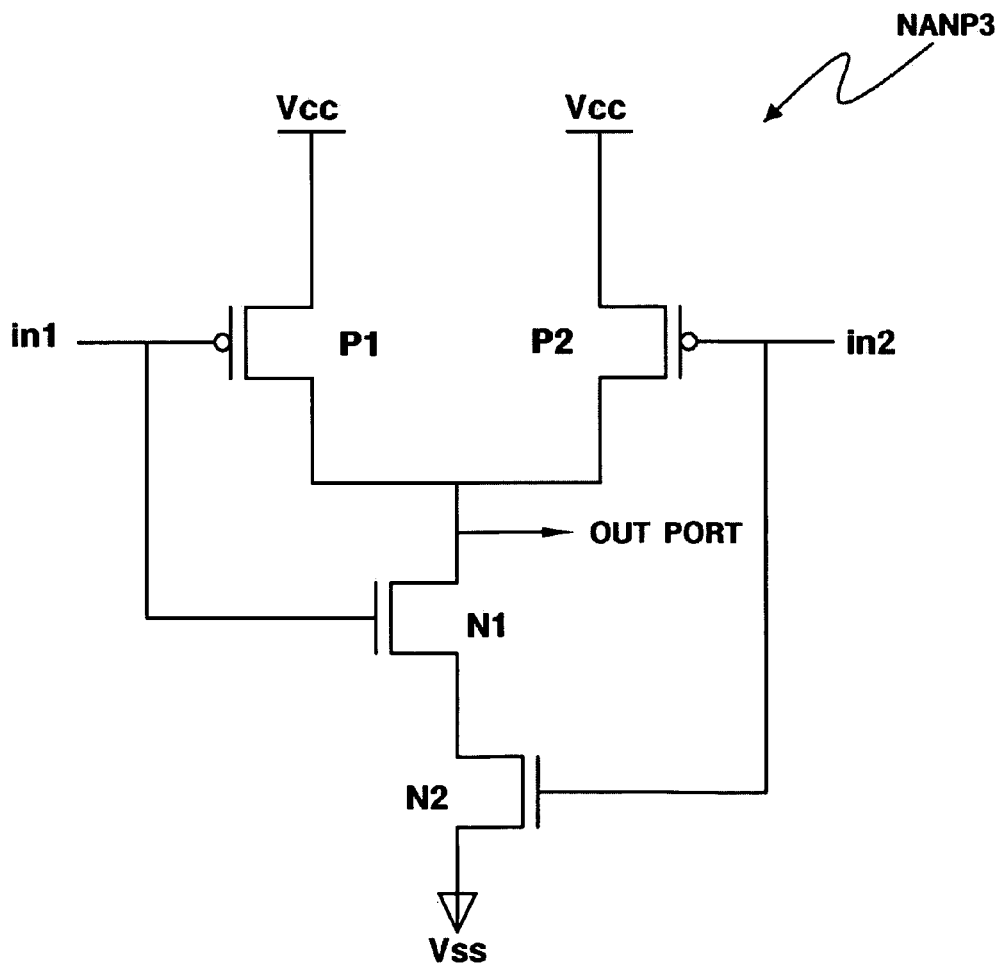
FIG. 5 illustrates a circuit diagram of the third NAND gate of FIG. 4 according to another example embodiment of the present invention.

FIG. 5 illustrates a circuit diagram of the third NAND gate NAND3 of FIG. 4 according to another example embodiment of the present invention.

In another example embodiment of the present invention, referring to FIG. 5, the third NAND gate NAND3 may include PMOS transistors P1 and P2, which may be connected in parallel between a power supply voltage Vcc and an output port OUT PORT and may further receive the output signal in1 from the first NAND gate NAND1 and an output signal in2 from the second NAND gate NAND2, respectively. The third NAND gate NAND3 may further include NMOS transistors N1 and N2, which may be connected in series between the output port OUT PORT and a ground voltage Vss and may further receive the output signal in1 of the first NAND gate NAND1 and the output signal in2 of the second NAND gate NAND2, respectively.

In another example embodiment of the present invention, if at least one of the output signals in1 and in2 of the first and second NAND gates NAND1 and NAND2, respectively, is at a first logic level, the third NAND gate NAND3 may output a signal with a second logic level to the output port OUT PORT. If the output signals in1 and in2 of the first and second NAND gates NAND1 and NAND2 respectively, are at the second logic level, the NMOS transistors Ni and N2 may enable the third NAND gate NAND3 to output a signal at the first logic level to the output port OUT PORT.

In another example embodiment of the present invention, the first logic level may be a "low" logic level and the second logic level may be a "high" logic level.

In another example embodiment of the present invention, the first logic level may be a "high" logic level and the second logic level may be a "low" logic level.

Figure 6:
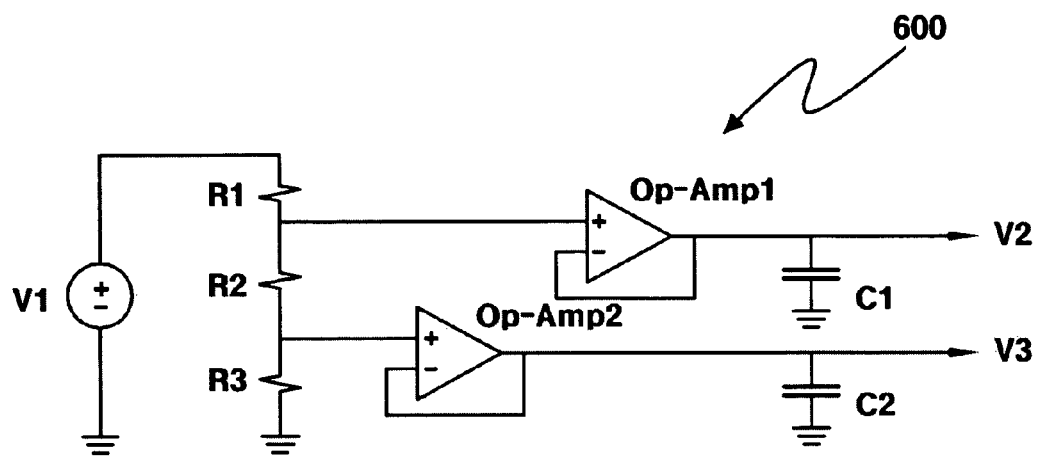
FIG. 6 illustrates a circuit diagram of a voltage converter according to another example embodiment of the present invention.

FIG. 6 illustrates a circuit diagram of a voltage converter 600 according to another example embodiment of the present invention. The voltage converter 600 may be a portion of the semiconductor integrated circuits 120 and/or 220.

In another example embodiment of the present invention, referring to FIG. 6, the voltage converter 600 may include resistors R1, R2, and/or R3, operational amplifiers Op-Amp1 and/or Op-Amp2, and/or load capacitors C1 and/or C2.

In another example embodiment of the present invention, a voltage V1 may be supplied from a system board to the package 100/200 through the signal I/O ports 160/260. Voltages V2 and V3 may be supplied from the capacitors C1 and C2, respectively. The voltages V2 and V3 may vary with the resistance of the resistors R1, R2, and/or R3. The voltages V2 and V3 may be described with the following equations.

$$V2 = \frac{R2 + R3}{R1 + R2 + R3} V1 \quad (1)$$

$$V3 = \frac{R3}{R1 + R2 + R3} V1 \quad (2)$$

In another example embodiment of the present invention, a fine pitch ball grid array (BGA) with 272 pins may include 26 pins associated with a power supply voltage V1 of 3.3 V, 26 pins associated with a power supply voltage V2 of 2.5 V, and 3 pins associated with a power supply voltage V3 of 1.2 V.

In another example embodiment of the present invention, referring to FIG. 6, a semiconductor substrate including the voltage converter 600 may not require pins for the power supply voltage V2 of 2.5 V and/or the power supply voltage V3 of 1.2 V. In other words, the number of signal I/O ports 160/260 may be reduced since the pins for voltage V1 may be used to power voltages V1, V2 and V3. Further, with respect to the power supply voltage V1 of 3.3 V, a relatively small number of pins (e.g., 26 pins) may be used for supplying power to the package 100/200.

In another example embodiment of the present invention, passive elements (e.g., capacitors) may be mounted on the semiconductor substrate along with the voltage converter

600, and a power supply voltage may be supplied from the system board to a microelectronic chip via the voltage converter 600 and the passive elements. The passive elements (e.g., capacitors) may be formed on the semiconductor substrate and may stabilize the power supply voltage. Thus, it may be possible to provide a stable power supply voltage to the microelectronic chip using fewer pins than in the conventional packaging technique. For example, the number of pins required for a power supply voltage (V1) of 3.3 V may be reduced to 10 pins or less.

In another example embodiment of the present invention, the number of required signal I/O ports 160/260 for the power supply voltages V1, V2, and V3 may be reduced from 55 pins to 10 pins or less, which may indicate a decrease of at least 80% with respect to the number of pins necessary for the power supply voltages V1, V2, and V3. The decrease in the number of pins required for the power supply voltages V1, V2, and V3, may enable a reduction of the package size, since the number of pins within a package may determine at least in part the minimum size for the package. Further, the process of designing a system board may be simplified because only one power supply voltage may be transmitted to the package.

In another example embodiment of the present invention, a single power supply voltage, which may be supplied from a system board to the package, may be converted to a plurality of power supply voltages with a voltage converter mounted on the semiconductor substrate 110/210 such that the plurality of power supply voltages may be supplied to their associated devices within a system on chip (SOC). Thus, a portion of the plurality of signal I/O ports 160/260 may be replaced by single voltage signal I/O ports (i.e., I/O ports passing a same voltage level).

In another example embodiment of the present invention, a step-down voltage converter may be used as the voltage converter. However, it is understood that the voltage converter is not restricted to being a step-down voltage converter. For example, a step-up voltage converter may also be used as the voltage converter.

In another example embodiment of the present invention, the semiconductor integrated circuit 120/220 may include a circuit including passive elements. Examples of the passive elements may include at least one of a capacitor, an inductor, a resistor, a pass filter, and/or any other conventional passive element. When the microelectronic chip 130/230 operates at a high speed (e.g., 100 MHz or higher), fluctuation of a power supply voltage supplied thereto may occur. The fluctuation of the power supply voltage supplied to the microelectronic chip 130/230 may be prevented by connecting a capacitor to the microelectronic chip 130/230, thereby enabling a more stable, higher-speed operation of the microelectronic chip 130/230. The capacitor may also reduce an inductive path of the power supply voltage and may function as a local battery.

Figure 7:
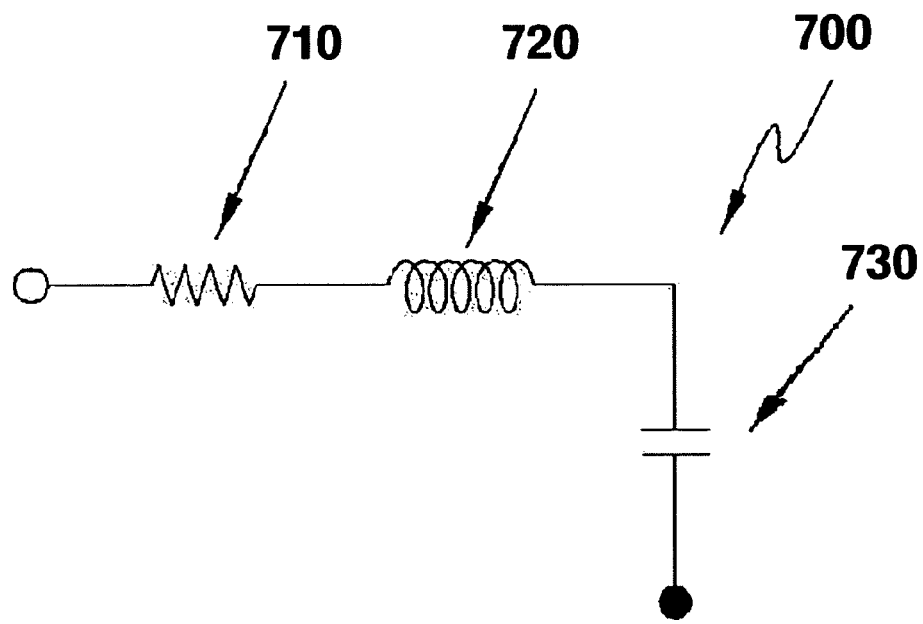
FIG. 7 illustrates a circuit diagram of a low pass filter according to another example embodiment of the present invention.

FIG. 7 illustrates a circuit diagram of a low pass filter 400 according to another example embodiment of the present invention. The low pass filter 400 may be a portion of the semiconductor integrated circuit 120/220.

In another example embodiment of the present invention, referring to FIG. 7, the low pass filter 400 may include a resistor 410, an inductor 420, and/or a capacitor 430.

In another example embodiment of the present invention, a package size may be reduced by a process of patterning. In this embodiment, patterning passive elements on a semiconductor substrate may reduce the package size. Further, a low pass filter and/or a high pass filter may be formed by connecting passive elements together, thereby enhancing operating characteristics of a microelectronic chip.

The example embodiments of the present invention being thus described, it will be obvious that the same may be varied in many ways. For example, above-described conductive materials have been given as examples only, and any well-known conductive material may be included.

Further, above-described surfaces (e.g., surfaces of the semiconductor substrate 110/210 and/or the semiconductor integrated circuit 120/220) may refer to any surface, and are not limited to a single surface but may refer to any number of surfaces on a device.

Such variations are not to be regarded as departure from the spirit and scope of the example embodiments of the present invention, and all such modifications as would be obvious to one skilled in the art are intended to be included within the scope of the following claims.

What is claimed is:

1. A package circuit board, comprising:
   an integrated circuit patterned on a first surface of a substrate on which a microelectronic chip is mounted, the integrated circuit processing at least one signal associated with the microelectronic chip; and
   a plurality of signal input/output (I/O) ports formed on a second surface of the substrate, the second surface not including the first surface, at least a portion of the second surface being electrically connected to the integrated circuit,
   wherein the integrated circuit comprises at least one passive element mounted on the substrate and the at least one passive element includes at least one of a capacitor, an inductor, a resistor, and a pass filter.

2. The package circuit board of claim 1, wherein the at least one associated signal includes at least one of a signal input to the microelectronic chip and a signal output from the microelectronic chip.

3. The package circuit board of claim 1, wherein the substrate is a silicon substrate.

4. The package circuit board of claim 3, wherein the integrated circuit is formed on the silicon substrate.

5. A package circuit board, comprising: an integrated circuit patterned on a first surface of a substrate on which a microelectronic chip is mounted, the integrated circuit processing at least one signal associated with the microelectronic chip; and
   a plurality of signal input/output (I/O) ports formed on a second surface of the substrate, the second surface not including the first surface, at least a portion of the second surface being electrically connected to the integrated circuit,
   wherein the integrated circuit includes at least one of a multiplexer and a voltage converter.

6. The package circuit board of claim 1, wherein the pass filter includes at least one of a band pass filter, a low pass filter and a high pass filter.

7. The package circuit board of claim 5, wherein the integrated circuit includes at least one multiplexer and the microelectronic chip includes at least two devices, the at least two devices being activated by a selection of the at least one multiplexer.

8. The package circuit board of claim 5, wherein the integrated circuit includes at least one voltage converter and the microelectronic chip requires supply voltages of at least two voltage levels.

9. The package circuit board of claim 1, wherein the integrated circuit is connected to the microelectronic chip with a first electrical connection and at least one of the plurality of signal I/O ports are electrically connected to the integrated circuit with a second electrical connection.

10. The package circuit board of claim 1, wherein the plurality signal I/O ports include at least one solder ball.

11. The package circuit board of claim 1, wherein the first at least one surface is encapsulated using an insulating encapsulation resin.

12. The package circuit board of claim 9, wherein the first electrical connection includes at least one of wire bonding and flip chip bonding.

13. The package circuit board of claim 9, wherein the plurality of signal I/O ports include solder balls, the second electrical connection is a conductive material in a via hole and a surface of the substrate including the microelectronic chip and the first electrical connection is encapsulated with an insulating encapsulation resin.

14. The package circuit board of claim 13, wherein the via hole is formed through the substrate.

15. The package of claim 13, wherein the first electrical connection includes at least one of wire bonding and flip chip bonding.

16. A package circuit board, comprising:
   a plurality of input/output (I/O) ports including a plurality of power supply pins; and
   a substrate for receiving a single power supply voltage from the plurality of power supply pins and converting the single power supply voltage into at least one other power supply voltage, wherein a microelectronic chip is mounted on a portion of the substrate and the microelectronic chip includes at least one device requiring the at least one other power supply voltage, wherein the substrate includes a voltage converter for converting the single power supply voltage into the at least one other required power supply voltage.

17. A method of forming the package circuit board of claim 1.

18. A method of forming the package circuit board of claim 16.

19. The package circuit board of claim 1, wherein the microelectronic chip is mounted on the integrated circuit pattern.

20. The package circuit board of claim 19, further comprising:
   at least one chip pad on the microelectronic chip;
   at least one substrate pad on the substrate;
   at least one first wire configured to electrically connect the at least one chip pad to the at least one substrate pad;
   at least one wiring pattern on the first surface of the substrate configured to connect the at least one substrate pad to the integrated circuit.

21. The package circuit board of claim 20, wherein the at least one wiring pattern on the first surface of the substrate is configured to directly connect the at least one substrate pad to the integrated circuit.

22. The package circuit board of claim 1, wherein the integrated circuit is not within the microelectronic chip.

* * * * *